(12) United States Patent
Niu et al.

(10) Patent No.: US 10,439,162 B2
(45) Date of Patent: Oct. 8, 2019

(54) DISPLAY PANEL, DISPLAY APPARATUS HAVING THE SAME, AND FABRICATING METHOD THEREOF

(71) Applicant: BOE TECHNOLOGY GROUP CO., LTD., Beijing (CN)

(72) Inventors: Yanan Niu, Beijing (CN); Hongwei Tian, Beijing (CN); Lei Chen, Beijing (CN); Zengsheng He, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 120 days.

(21) Appl. No.: 15/533,443

(22) PCT Filed: Nov. 8, 2016

(86) PCT No.: PCT/CN2016/105069
§ 371 (c)(1),
(2) Date: Jun. 6, 2017

(87) PCT Pub. No.: WO2017/206440
PCT Pub. Date: Dec. 7, 2017

(65) Prior Publication Data
US 2018/0198086 A1 Jul. 12, 2018

(30) Foreign Application Priority Data

May 30, 2016 (CN) .......................... 2016 1 0371848

(51) Int. Cl.
*G09G 3/3225* (2016.01)
*H01L 51/52* (2006.01)
*H01L 27/32* (2006.01)

(52) U.S. Cl.
CPC ....... *H01L 51/5237* (2013.01); *G09G 3/3225* (2013.01); *H01L 27/3244* (2013.01); *H01L 51/5253* (2013.01); *G09G 2310/0264* (2013.01)

(58) Field of Classification Search
CPC ............. H01L 51/5253; H01L 51/5256; H01L 51/5259; H01L 51/5237; G09G 3/321; G09G 3/3225
See application file for complete search history.

(56) References Cited

U.S. PATENT DOCUMENTS

2012/0282419 A1* 11/2012 Ahn ....................... B82Y 30/00
428/34.8
2015/0123098 A1* 5/2015 Kang .................. H01L 51/5253
257/40
2017/0179428 A1 6/2017 Li et al.

FOREIGN PATENT DOCUMENTS

CN 103682054 A 3/2014
CN 103871684 A 6/2014
(Continued)

OTHER PUBLICATIONS

International Search Report & Written Opinion dated Mar. 8, 2017, regarding PCT/CN2016/105069.
(Continued)

*Primary Examiner* — Vijay Shankar
*Assistant Examiner* — Cory A. Almeida
(74) *Attorney, Agent, or Firm* — Intellectual Valley Law, P.C.

(57) ABSTRACT

The present application discloses a display panel having a display unit and an encapsulating structure for encapsulating the display unit. The encapsulating structure includes a growth layer on the display unit; and a graphene layer on a side of the growth layer distal to the display unit.

20 Claims, 3 Drawing Sheets

(56) References Cited

FOREIGN PATENT DOCUMENTS

| CN | 104553115 A  | 4/2015  |
|----|--------------|---------|
| CN | 104638562 A  | 4/2015  |
| CN | 104835920 A  | 8/2015  |
| KR | 101463936 B1 | 11/2014 |

OTHER PUBLICATIONS

First Office Action in the Chinese Patent Application No. 201610371848.4, dated May 31, 2017; English translation attached.
Second Office Action in the Chinese Patent Application No. 201610371848.4, dated Sep. 25, 2017; English translation attached.

* cited by examiner

FIG. 4

Forming a display unit including:
    forming a second portion which is a driving unit for driving the first portion; and
    forming a first portion of the display unit for displaying an image on the second portion.

↓

Forming a diffusion barrier layer on a side of the first portion distal to the second portion.

↓

Forming a growth layer on a side of the diffusion barrier layer distal to the first portion.

↓

Forming a graphene layer on a side of the growth layer distal to the display unit.

FIG. 5A

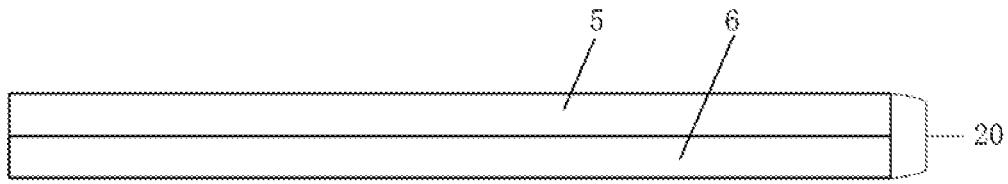

FIG. 5B

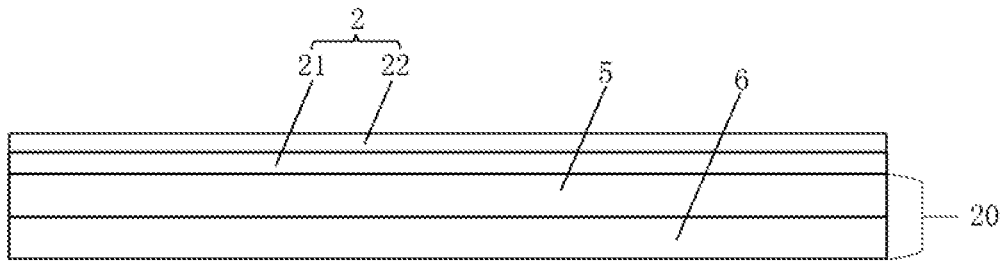

DISPLAY PANEL, DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application No. PCT/CN2016/105069 filed November 08, 2016, which claims priority to Chinese Patent Application No. 201610371848.4, filed May 30, 2016, the contents of which are incorporated by reference in the entirety.

TECHNICAL FIELD

The present invention relates to display technology, more particularly, to a display panel, a display apparatus having the same, and a fabricating method thereof.

BACKGROUND

Display apparatuses such as liquid crystal display (LCD) apparatuses and organic light-emitting display (OLED) apparatuses have been widely used. Thin film transistor liquid crystal display (TFT-LCD) occupies a dominant position in the current flat panel display market due to the features of small size, low power consumption, relatively low manufacturing cost and no radiation, and so on. Active matrix organic light emitting diode (AMOLED) display panel uses independent thin film transistor to control each pixel. Each pixel can continuously and independently drive light emitting. As compared to conventional TFT-LCD display panels, AMOLED display panels have the advantages of faster response, higher contrast, and wider viewing angle.

SUMMARY

In one aspect, the present invention provides a display panel comprising a display unit and an encapsulating structure for encapsulating the display unit, the encapsulating structure comprising a growth layer on the display unit; and a graphene layer on a side of the growth layer distal to the display unit.

Optionally, the growth layer is a metal layer having a thickness in a range of approximately 3 nm to approximately 10 nm.

Optionally, the growth layer comprises copper.

Optionally, the graphene layer has a thickness in a range of approximately 2 nm to approximately 10 nm.

Optionally, the encapsulating structure further comprises a diffusion barrier layer on a side of the growth layer proximal to the display unit for preventing diffusion of growth layer material into the display unit.

Optionally, the diffusion barrier layer comprises a first diffusion barrier sub-layer.

Optionally, the diffusion barrier layer further comprises a second diffusion barrier sub-layer on a side of the first diffusion barrier sub-layer proximal to the growth layer.

Optionally, the diffusion barrier layer comprises a plurality of first diffusion barrier sub-layers and a plurality of second diffusion barrier sub-layers alternatedly disposed.

Optionally, the first diffusion barrier sub-layer has a thickness in a range of approximately 50 nm to approximately 200 nm.

Optionally, the second diffusion barrier sub-layer has a thickness in a range of approximately 50 nm to approximately 200 nm.

Optionally, the diffusion barrier layer has a thickness in a range of approximately 0.1 μm to approximately 10 mm.

Optionally, the diffusion barrier layer comprises one or both of silicon oxide and silicon nitride.

In another aspect, the present invention provides an illumination light source comprising a display unit and an encapsulating structure for encapsulating the display unit, the encapsulating structure comprising a growth layer on the display unit; and a graphene layer on a side of the growth layer distal to the display unit.

In another aspect, the present invention provides a method of fabricating a display panel comprising a display unit and an encapsulating structure for encapsulating the display unit, the method comprising forming a display unit; forming a growth layer on the display unit; and forming a graphene layer on a side of the growth layer distal to the display unit.

Optionally, the graphene layer is formed to have a thickness in a range of approximately 2 nm to approximately 10 nm.

Optionally, the growth layer is formed using copper.

Optionally, prior to forming the growth layer, the method further comprises forming a diffusion barrier layer on a side of the growth layer proximal to the display unit for preventing diffusion of growth layer material into the display unit; wherein the growth layer is formed on a side of the diffusion barrier layer distal to the display unit.

Optionally, forming the graphene layer comprises growing the graphene layer on the growth layer using a chemical vapor deposition method.

Optionally, forming the diffusion layer comprises forming a plurality of sub-layers by a deposition method; the plurality of sub-layers are formed to comprise a plurality of first diffusion barrier sub-layers and a plurality of second diffusion barrier sub-layers alternatedly disposed; deposition rates for forming the plurality of sub-layers increase from a first value to a second value, and decrease from a second value to a third value; and the first value and the second value are deposition rates for forming a sub-layer most proximal to the display unit and a sub-layer most proximal to the growth layer, respectively.

In another aspect, the present invention provides a display apparatus comprising a display panel described herein or fabricated by a method described herein.

BRIEF DESCRIPTION OF THE FIGURES

The following drawings are merely examples for illustrative purposes according to various disclosed embodiments and are not intended to limit the scope of the present invention.

FIG. 4 is a flow chart illustrating a process of fabricating a display panel in some embodiments according to the present disclosure.

FIGS. 5A-5D illustrate a process of fabricating a display panel in some embodiments according to the present disclosure.

DETAILED DESCRIPTION

Figure 1:
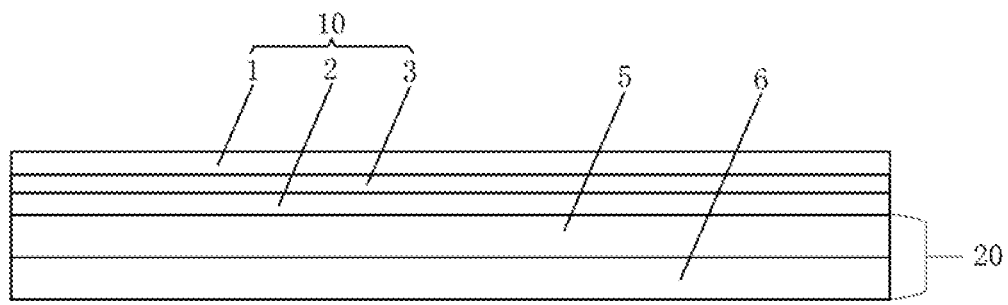
FIG. 1 is a diagram illustrating the structure of a display panel in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Typically, conventional display panels include an encapsulating structure to protect the display elements from external moisture and oxygen. For example, the encapsulating structure may be made of glass or metal to isolate the display elements. The encapsulating structure is then sealed onto the array substrate using an encapsulating adhesive such as an optical clear resin, thereby encapsulating display elements. However, the flexibility of an encapsulating structure made of glass or metal is limited, thus such an encapsulating structure is not suitable for making flexible display panels. The fabrication of the inflexible encapsulating structure is complicated and prone to defects.

Typically, conventional flexible display panels use a flexible substrate such as an inorganic thin film having a high hermeticity, e.g., a thin silicon oxide film, and a polymer film such as a polyimide film. In some display panels, the encapsulating structure includes a laminated structure of inorganic films and polymer films to obtain an acceptable flexibility and moisture resistance. However, the polymer film is prone to fabrication defects, affecting moisture resistance and oxygen resistance of the encapsulating structure. A multi-layer structure requires a complicated manufacturing process, resulting in a high manufacturing cost and a low manufacturing efficiency.

Accordingly, the present invention provides, inter alia, a display panel, a display apparatus having the same, and a fabricating method thereof that substantially obviate one or more of the problems due to limitations and disadvantages of the related art. In one aspect, the present disclosure provides a display panel including a display unit and an encapsulating structure for encapsulating the display unit. In some embodiments, the encapsulating structure includes a growth layer on the display unit; and a graphene layer on a side of the growth layer distal to the display unit.

As used herein, the term "display unit" refers to a combination of a first portion of the display unit for displaying an image and a second portion which is a driving unit for driving the first portion. Optionally, the present display panel is an organic light emitting diode display panel. Optionally, the display panel is an organic light emitting diode display panel, and the display unit in the organic light emitting diode display panel refers to an organic light-emitting diode and a thin film transistor for driving the same. Optionally, the present display panel is a liquid crystal display panel. Optionally, the present display panel is a liquid crystal display panel, and the display unit in the liquid crystal display panel refers to a liquid crystal layer, a common electrode, a pixel electrode, as well as a thin film transistor for driving image display.

FIG. 1 is a diagram illustrating the structure of a display panel in some embodiments according to the present disclosure. Referring to FIG. 1, the display panel in some embodiments includes a display unit 20 and an encapsulating structure 10 for encapsulating the display unit. The encapsulating structure 10 includes a growth layer 3 on the display unit 20; and a graphene layer 1 on a side of the growth layer 3 distal to the display unit 20.

In some embodiments, the display unit 20 includes a first portion 5 of the display panel for displaying an image (e.g., display elements) and a second portion 6 which is a driving unit for driving the first portion (e.g., a thin film transistor driving back plane).

In some embodiments, the display panel is an organic light emitting diode display panel, e.g., a flexible organic light emitting diode display panel. Optionally, the display unit 20 includes an organic light emitting diode. The display panel includes a plurality of subpixels, each of which has a display unit. Optionally, the organic light emitting diode includes an anode, an organic functional layer on the anode, and a cathode on a side of the light emitting layer distal to the anode. The organic functional layer may include a hole transport layer on the anode, a light emitting layer on a side of the hole transport layer distal to the anode, an electron transport layer on a side of the light emitting layer distal to the hole transport layer. Optionally, for enhancing light emitting efficiency, the organic functional layer further includes a hole injection layer on a side of the hole transport layer proximal to the anode, and an electron injection layer on a side of the electron transport layer proximal to the cathode.

Graphene is a highly stable material that is flexible and light transmitting. A display panel encapsulated by a graphene layer can be made highly resistant to cracking or other physical deformation and damages. Inclusion of a graphene layer in the display panel significantly enhances flexibility, portability, and various operations of the display panel.

The growth layer 3 provides a surface for subsequent graphene layer growth on the surface. In some embodiments, the growth layer 3 can be made of a material that is capable of adhering graphene molecules, facilitating initial seeding and subsequent growth of the graphene molecules. Optionally, the growth layer 3 includes a metal material. Examples of appropriate metal materials for making the growth layer 3 include, but are not limited to, copper, iron, cobalt, nickel, gold, silver, aluminum, tin, palladium, platinum, molybdenum, zinc, manganese, titanium, chromium, or an alloy of two or more of the above. Optionally, the growth layer 3 is made of a transparent metal material having excellent flexibility and stretchability. By having such a growth layer 3 in combination with the graphene layer 1, the flexibility and stretchability of the display panel are greatly enhanced, making it highly resistant to cracking or other physical deformation and damages. Optionally, the growth layer 3 is made of copper.

Various appropriate growth layer materials and various appropriate fabricating methods may be used to make the growth layer 3. For example, a growth layer material may be deposited on the substrate by sputtering. Examples of appropriate growth layer materials for making the growth layer 3 include, but are not limited to, nickel, iron, cobalt, nickel, gold, silver, or an alloy of two or more of the above.

Optionally, the graphene layer 1 has a thickness in a range of approximately 0.5 nm to approximately 100 nm, e.g., approximately 1 nm to approximately 50 nm, approximately 2 am to approximately 20 nm, approximately 2 nm to approximately 10 nm, approximately 2 nm to approximately 4 nm, approximately 4 nm to approximately 6 nm, approximately 6 nm to approximately 8 nm, approximately 8 nm to approximately 10 nm.

Referring to FIG. 1, the encapsulating structure 10 in some embodiments further includes a diffusion barrier layer 2 on a side of the growth layer 3 proximal to the display unit 20 for preventing diffusion of growth layer material (e.g., copper) into the display unit, e.g., the diffusion barrier layer 2 is sandwiched between the display unit 10 and the growth layer 3. By having a diffusion barrier layer 2 between the growth layer 3 and the display unit 20, diffusion of growth layer material into the display unit 20 and potential damages to the display unit 20 caused by the diffusion can be effectively prevented.

Various appropriate diffusion barrier materials and various appropriate fabricating methods may be used to make the diffusion barrier layer 2. For example, a diffusion barrier material may be deposited on the substrate by a plasma-enhanced chemical vapor deposition (PECVD) process and patterned. Examples of appropriate diffusion barrier materials for making the diffusion barrier layer include, but are not limited to, various oxides, nitrides and oxynitrides such as metal oxides, metal nitrides, metal oxynitrides, non-metal oxides, non-metal nitrides, non-metal oxynitrides, and a combination thereof. Optionally, the diffusion barrier material is silicon oxide ($SiO_x$), silicon nitride ($SiN_y$, e.g., $Si_3N_4$), or a combination thereof.

In some embodiments, the diffusion barrier layer 2 includes a first diffusion barrier sub-layer, e.g., the diffusion barrier layer 2 has a single layer structure consisting of the first diffusion barrier sub-layer. Optionally, the first diffusion barrier sub-layer has a thickness in a range of approximately 50 nm to approximately 200 nm, e.g., approximately 50 nm to approximately 100 nm, approximately 100 nm to approximately 150 nm, approximately 150 nm to approximately 200 nm. By having a thin diffusion barrier layer 2, the fabricating process may be made cost-effective. Optionally, the first diffusion barrier sub-layer is made of silicon oxide for effectively preventing diffusion of growth layer material (e.g., copper) into the display unit 20.

Figure 2:
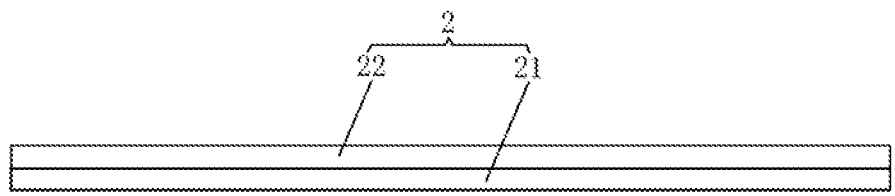
FIG. 2 is a diagram illustrating the structure of a diffusion barrier in some embodiments according to the present disclosure.

In some embodiments, the diffusion barrier layer 2 includes a first diffusion barrier sub-layer, and a second diffusion barrier sub-layer on a side of the first diffusion barrier sub-layer proximal to the growth layer 3. FIG. 2 is a diagram illustrating the structure of a diffusion barrier in some embodiments according to the present disclosure. Referring to FIG. 2, the diffusion barrier layer 2 in some embodiments includes a first diffusion barrier sub-layer 21 and a second diffusion barrier sub-layer 22. The second diffusion barrier sub-layer 22 is on a side of the first diffusion barrier sub-layer 21 proximal to the growth layer 3 (not shown in FIG. 2), and on a side of the first diffusion barrier sub-layer 21 distal to the display unit 20 (not shown in FIG. 2). Optionally, the diffusion barrier layer 2 includes a single first diffusion barrier sub-layer 21 and a single second diffusion barrier sub-layer 22, e.g., the diffusion barrier layer 2 has a two-layer structure consisting of a first diffusion barrier sub-layer 21 and a second diffusion barrier sub-layer 22. Inclusion of a second diffusion barrier sub-layer 22 in the diffusion barrier layer 2 further prevent diffusion of growth layer material into the display unit and damages to the display unit caused by the diffusion. Optionally, the first diffusion barrier sub-layer 21 has a thickness in a range of approximately 50 nm to approximately 200 nm, e.g., approximately 50 nm to approximately 100 nm, approximately 100 nm to approximately 150 run, approximately 150 nm to approximately 200 nm. Optionally, the second diffusion barrier sub-layer 22 has a thickness in a range of approximately 50 nm to approximately 200 nm, e.g., approximately 50 nm to approximately 100 run, approximately 100 nm to approximately 150 nm, approximately 150 nm to approximately 200 nm. By having a thin diffusion barrier layer 2, the fabricating process may be made cost-effective. Optionally, the first diffusion barrier sub-layer 21 and the second diffusion barrier sub-layer 22 are respectively made of two different materials selected from silicon oxide ($SiO_x$) and silicon nitride ($SiN_y$, e.g., $Si_3N_4$). Optionally, the first diffusion barrier sub-layer is made of silicon oxide, and the second diffusion barrier sub-layer is made of silicon nitride.

Figure 3:
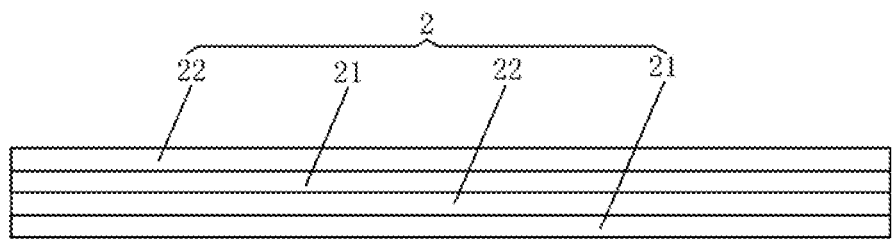
FIG. 3 is a diagram illustrating the structure of a diffusion barrier in some embodiments according to the present disclosure.

In some embodiments, the diffusion barrier layer includes a plurality of first diffusion barrier sub-layers and a plurality of second diffusion barrier sub-layers alternatedly disposed. FIG. 3 is a diagram illustrating the structure of a diffusion barrier in some embodiments according to the present disclosure. Referring to FIG. 3, the diffusion barrier layer 2 in some embodiments includes a plurality of first diffusion barrier sub-layers 21 and a plurality of second diffusion barrier sub-layers 22 alternatedly disposed. As shown in FIG. 3, the diffusion barrier layer 2 includes a first diffusion barrier sub-layers 21 on the display unit 20 (not shown in FIG. 3), a second diffusion barrier sub-layers 22 on a side of the first diffusion barrier sub-layers 21 distal to the display unit 20, an additional first diffusion barrier sub-layers 21 on a side of the second diffusion barrier sub-layers 22 distal to the first diffusion barrier sub-layers 21, and an additional second diffusion barrier sub-layers 22 on a side of the additional first diffusion barrier sub-layers 21 distal to the second diffusion barrier sub-layers 22.

By having a plurality of first diffusion barrier sub-layers and a plurality of second diffusion barrier sub-layers alternatedly disposed in the diffusion barrier layer, diffusion of growth layer material into the display unit and damages to the display unit caused by the diffusion can be prevented to a higher degree as compared to the single sub-layer or double sub-layer structure. Optionally, the total number of sub-layers (including first diffusion barrier sub-layers and second diffusion barrier sub-layers) is in a range of 3 to n, $3 < n \leq 50$. Optionally, each first diffusion barrier sub-layer has a thickness in a range of approximately 50 nm to approximately 200 nm, e.g., approximately 50 nm to approximately 100 nm, approximately 100 nm to approximately 150 nm, approximately 150 nm to approximately 200 nm. Optionally, each second diffusion barrier sub-layer has a thickness in a range of approximately 50 nm to approximately 200 nm, e.g., approximately 50 nm to approximately 100 nm, approximately 100 nm to approximately 150 nm, approximately 150 nm to approximately 200 nm. Optionally, the diffusion barrier layer has a thickness in a range of approximately 0.1 μm to approximately 10 mm, e.g., approximately 0.1 μm to approximately 100 μm, approximately 100 μm to approximately 1 mm, approximately 1 mm to approximately 5 mm, approximately 5 mm to approximately 10 mm. Optionally, the first diffusion barrier sub-layer 21 and the second diffusion barrier sub-layer 22 are respectively made of two different materials selected from silicon oxide ($SiO_x$) and silicon nitride ($SiN_y$, e.g., $Si_3N_4$). Optionally, the first diffusion barrier sub-layer is made of silicon oxide, and the second diffusion barrier sub-layer is made of silicon nitride.

In some embodiments, the display unit 20 includes a first portion 5 of the display unit for displaying an image (e.g., display elements) and a second portion 6 which is a driving unit for driving the first portion 5 (e.g., a thin film transistor driving back plane). Optionally, the second portion 6 is a flexible thin film transistor driving back plane.

Optionally, the present encapsulating layer is used in a flexible display panel and a flexible display panel. Optionally, the present encapsulating layer is used in an inflexible display panel and an inflexible display panel.

In conventional graphene fabricating processes, the graphene layer has to be first formed on a substrate, then stripped off from the substrate. The graphene layer is then attached to the encapsulating structure using a transparent adhesive layer. As compared to the conventional processes, the present encapsulating structure has many advantages. In the present display panel, the growth layer is directly formed (e.g., sputtered) on the diffusion barrier layer, and the graphene layer is in turn directly grown (e.g., by chemical vapor deposition) on the growth layer, thereby forming the entire encapsulating structure in situ on the display panel. A large-area, intact graphene layer can be formed in the present display panel. Thus, the present encapsulating structure has a high hermeticity, making the display panel highly moisture resistant and oxygen resistant. The combination of a growth layer and a graphene layer in the encapsulating structure can effectively relieve stress in the display panel, e.g., in response to being folded or rolled, and reduce defects such as pinholes. The display panel having the present encapsulating structure is highly flexible. Moreover, the display panel having the present encapsulating structure may be fabricated in a highly simplified, cost-effective, and efficient process. Optionally, the growth layer is in direct contact with the diffusion barrier layer, and the graphene layer is in direct contact with the growth layer.

In another aspect, the present disclosure provides a method of fabricating a display panel having a display unit and an encapsulating structure for encapsulating the display unit, the method includes forming a display unit; forming a growth layer on the display unit; and forming a graphene layer on a side of the growth layer distal to the display unit. FIG. 4 is a flow chart illustrating a process of fabricating a display panel in some embodiments according to the present disclosure. Referring to FIG. 4, the process in some embodiments includes forming a display unit including forming a second portion which is a driving unit for driving the first portion (e.g., a thin film transistor driving back plane) and forming a first portion of the display unit for displaying an image (e.g., display elements) on the second portion; forming a diffusion barrier layer on a side of the first portion distal to the second portion; forming a growth layer on a side of the diffusion barrier layer distal to the first portion; and forming a graphene layer on a side of the growth layer distal to the display unit.

Figure 5C:
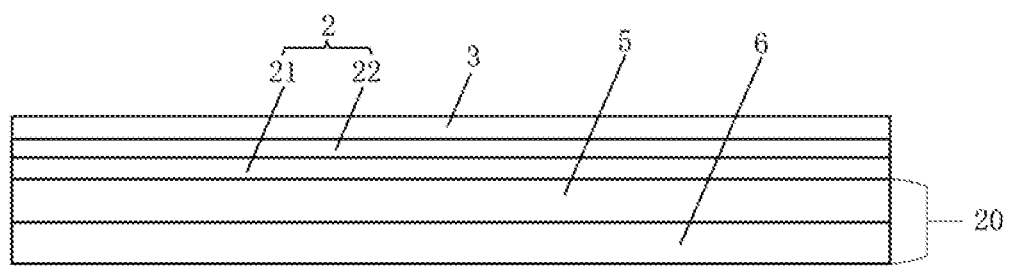

FIGS. 5A-5D illustrate a process of fabricating a display panel in some embodiments according to the present disclosure. Referring to FIG. 5A, the process in some embodiments includes forming a first portion 5 of the display unit on the second portion 6.

In some embodiments, the display panel is an organic light emitting diode display panel, e.g., a flexible organic light emitting diode display panel. Optionally, the display unit includes an organic light emitting diode. The display panel includes a plurality of subpixels, each of which has a display unit. Optionally, the step of forming the first portion 5 includes forming an anode, forming an organic functional layer on the anode, and forming a cathode on a side of the light emitting layer distal to the anode. Optionally, the step of forming the first portion 5 further includes forming a hole transport layer on the anode, forming a light emitting layer on a side of the hole transport layer distal to the anode, and forming an electron transport layer on a side of the light emitting layer distal to the hole transport layer. Optionally, the step of forming the first portion 5 further includes forming a hole injection layer on a side of the hole transport layer proximal to the anode, and forming an electron injection layer on a side of the electron transport layer proximal to the cathode.

Referring to FIG. 5B, the process in some embodiments includes forming a diffusion barrier layer on a side of the first portion 5 distal to the second portion 6. As shown in FIG. 5B, the step of forming the diffusion barrier layer 2 includes forming a single first diffusion barrier sub-layer 21 on a side of the first portion 5 distal to the second portion 6, and forming a single second diffusion barrier sub-layer 22 on a side of the first diffusion barrier sub-layer 21 distal to the first portion 5. Optionally, the first diffusion barrier sub-layer 21 and the second diffusion barrier sub-layer 22 are formed using respectively two different materials selected from silicon oxide ($SiO_x$) and silicon nitride ($SiN_y$, e.g., $Si_3N_4$). Optionally, the first diffusion barrier sub-layer is made of silicon oxide, and the second diffusion barrier sub-layer is made of silicon nitride.

In some embodiments, the diffusion barrier layer is formed to include a first diffusion barrier sub-layer, e.g., the diffusion barrier layer 2 is formed to have a single layer structure consisting of the first diffusion barrier sub-layer.

In some embodiments, the diffusion barrier layer is formed to include a plurality of first diffusion barrier sub-layers and a plurality of second diffusion barrier sub-layers alternatedly disposed. Optionally, a deposition rate for forming a central sub-layer is higher than that for forming a peripheral sub-layer in the diffusion barrier layer. A peripheral sub-layer is a sub-layer proximal to one of the two surfaces of the diffusion barrier layer (e.g., a first surface proximal to the growth layer and a second surface proximal to the display unit). A central sub-layer, on the other hand, is a sub-layer distal to both of the two surfaces. Optionally, deposition rates for forming a plurality of alternately disposed diffusion barrier sub-layers increase from a first value to a second value, and then decrease from the second value to a third value. The first value is a deposition rate for forming a first sub-layer and the second value is a deposition rate for forming a last sub-layer. Optionally, the first sub-layer is the sub-layer most proximal to the display unit and the last sub-layer is the sub-layer most proximal to the growth layer. Optionally, each sub-layer of the diffusion barrier layer may be formed using a different deposition rate.

In one example, the diffusion barrier layer includes n sub-layers (including the first diffusion barrier sub-layer and the second diffusion barrier sub-layer). In another example, $(1+n)/2$ is a positive integer larger than 1, the deposition rate for forming the sub-layers increases from the first sub-layer (most proximal to the first portion 5) to the $[(1+n)/2]$-th sub-layer, and then decreases from the $[(1+n)/2]$-th sub-layer to the n-th sub-layer, with the $[(1+n)/2]$-th sub-layer corresponding to the highest deposition rate among all sub-layer. In another example, $(1+n)/2$ is not an integer, the $(1+n)/2$ is rounded up or rounded down to obtain an integer m, the deposition rate for forming the sub-layers increases from the first sub-layer (most proximal to the first portion 5) to the m-th sub-layer, and then decreases from the m-th sub-layer to the n-th sub-layer, with the m-th sub-layer corresponding to the highest deposition rate among all sub-layer. In another example, $n=4$, $(1+n)/2=2.5$, which is rounded down to obtain an integer 2 or rounded up to obtain an integer 3. Optionally, an increment or a decrement, in terms of percentage, in deposition rate from a sub-layer to an adjacent sub-layer in in a range of approximately 0.5% to approximately 50%. A diffusion barrier layer fabricated in this fashion has excellent interface characteristics and an enhanced ability to prevent diffusion of metal elements, is capable of effectively relieving interlayer stress. Moreover, parasitic capacitance does not present a significant issue in the present diffusion barrier layer. The present process greatly simplifies the fabrication process, improves production efficiency, and lowers the manufacturing costs.

Referring to FIG. 5C, the process in some embodiments further includes forming a growth layer 3 on a side of the diffusion barrier layer 2 distal to the first portion 5. Optionally, the growth layer 3 is formed by depositing a growth layer material using a physical vapor deposition method. Optionally, the growth layer 3 is formed using copper. Optionally, the growth layer 3 is formed to have a thickness in a range of approximately 0.5 nm to approximately 100 nm, e.g., approximately 1 nm to approximately 50 nm, approximately 2 nm to approximately 20 nm, approximately 3 nm to approximately 10 nm.

Figure 5D:
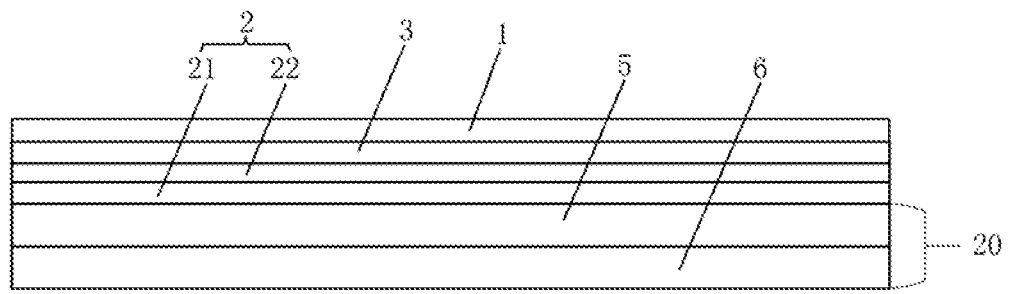

Referring to FIG. 5D, the process in some embodiments further includes forming a graphene layer 1 on a side of the growth layer 3 distal to the diffusion barrier layer 2. Optionally, the graphene layer 1 is formed by depositing a graphene material using a chemical vapor deposition method.

In a display panel fabricated by the present method, the growth layer is directly formed (e.g., sputtered) on the diffusion barrier layer, and the graphene layer is in turn directly grown (e.g., by chemical vapor deposition) on the growth layer, thereby forming the entire encapsulating structure in situ on the display panel. The encapsulating structure formed by the present method has a high hermeticity, making the display panel highly moisture resistant and oxygen resistant. The combination of a growth layer and a graphene layer in the encapsulating structure can effectively relieve stress in the display panel, e.g., in response to being folded or rolled, and reduce defects such as pinholes. The display panel having an encapsulating structure fabricated by the present method is highly flexible. Moreover, the display panel having the encapsulating structure may be fabricated in a highly simplified, cost-effective, and efficient process.

In another aspect, the present disclosure provides an illumination light source. In some embodiments, the illumination light source includes a display unit and an encapsulating structure for encapsulating the display unit. The encapsulating structure includes a growth layer on the display unit; and a graphene layer on a side of the growth layer distal to the display unit. Optionally, the growth layer is a metal layer having a thickness in a range of approximately 0.5 nm to approximately 100 nm, e.g., approximately 1 nm to approximately 50 nm, approximately 2 nm to approximately 20 nm, approximately 3 nm to approximately 10 nm. Optionally, the growth layer includes copper. Optionally, the graphene layer has a thickness in a range of approximately 0.5 nm to approximately 100 nm, e.g., approximately 1 am to approximately 50 nm, approximately 2 nm to approximately 20 nm, approximately 2 am to approximately 10 nm. Optionally, the encapsulating structure further includes a diffusion barrier layer on a side of the growth layer proximal to the display unit for preventing diffusion of growth layer material into the display unit. Optionally, the diffusion barrier layer comprises a first diffusion barrier sub-layer. Optionally, the diffusion barrier layer further includes a second diffusion barrier sub-layer on a side of the first diffusion barrier sub-layer proximal to the growth layer. Optionally, the diffusion barrier layer includes a plurality of first diffusion barrier sub-layers and a plurality of second diffusion barrier sub-layers alternatedly disposed. Optionally, the first diffusion barrier sub-layer has a thickness in a range of approximately 50 nm to approximately 200 nm. Optionally, the second diffusion barrier sub-layer has a thickness in a range of approximately 50 nm to approximately 200 nm. Optionally, the diffusion barrier layer has a thickness in a range of approximately 0.1 µm to approximately 10 mm. Optionally, the diffusion barrier layer comprises one or both of silicon oxide and silicon nitride.

In another aspect, the present disclosure provides a method of fabricating an illumination light source having a display unit and an encapsulating structure for encapsulating the display unit. In some embodiments, the method includes forming a display unit; forming a growth layer on the display unit; and forming a graphene layer on a side of the growth layer distal to the display unit. Optionally, the graphene layer is formed to have a thickness in a range of approximately 0.5 nm to approximately 100 nm, e.g., approximately 1 nm to approximately 50 nm, approximately 2 nm to approximately 20 nm, approximately 2 nm to approximately 10 nm. Optionally, the growth layer is formed using copper. Optionally, prior to forming the growth layer, the method further includes forming a diffusion barrier layer on a side of the growth layer proximal to the display unit for preventing diffusion of growth layer material into the display unit; the growth layer is formed on a side of the diffusion barrier layer distal to the display unit. Optionally, forming the graphene layer includes growing the graphene layer on the growth layer using a chemical vapor deposition method. Optionally, forming the diffusion layer includes forming a plurality of sub-layers by a deposition method; the plurality of sub-layers are formed to comprise a plurality of first diffusion barrier sub-layers and a plurality of second diffusion barrier sub-layers alternatedly disposed; deposition rates for forming the plurality of sub-layers increase from a first value to a second value, and decrease from a second value to a third value; and the first value and the second value are deposition rates for forming a sub-layer most proximal to the display unit and a sub-layer most proximal to the growth layer, respectively.

In another aspect, the present disclosure provides a display apparatus having a display panel described herein. Optionally, the display apparatus is a liquid crystal display apparatus. Optionally, the display apparatus is an organic light emitting diode display apparatus. Examples of appropriate display apparatuses includes, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising:
   a thin film transistor driving back plane comprising a plurality of thin film transistors;
   a plurality of display elements on the thin film transistor driving back plane;
   an encapsulating structure on a side of the plurality of display elements away from the thin film transistor driving back plane and encapsulating the plurality of display elements;
   wherein the encapsulating structure comprises:
   a diffusion barrier layer on a side of the plurality of display elements away from the thin film transistor driving back plane for preventing diffusion of growth layer material into the plurality of display elements;
   a growth layer on a side of the diffusion barrier layer away from the plurality of display elements; and
   a graphene layer on a side of the growth layer away from the diffusion barrier layer.

2. The display panel of claim 1, wherein the growth layer is a metal layer having a thickness in a range of approximately 3 nm to approximately 10 nm.

3. The display panel of claim 1, wherein the growth layer comprises copper.

4. The display panel of claim 1, wherein the graphene layer has a thickness in a range of approximately 2 nm to approximately 10 nm.

5. The display panel of claim 1, wherein the growth layer is directly adjacent to and in direct contact with the diffusion barrier layer.

6. The display panel of claim 5, wherein the diffusion barrier layer comprises a first diffusion barrier sub-layer.

7. The display panel of claim 6, wherein the diffusion barrier layer further comprises a second diffusion barrier sub-layer on a side of the first diffusion barrier sub-layer proximal to the growth layer.

8. The display panel of claim 7, wherein the second diffusion barrier sub-layer has a thickness in a range of approximately 50 nm to approximately 200 nm.

9. The display panel of claim 6, wherein the first diffusion barrier sub-layer has a thickness in a range of approximately 50 nm to approximately 200 nm.

10. The display panel of claim 5, wherein the diffusion barrier layer comprises a plurality of first diffusion barrier sub-layers and a plurality of second diffusion barrier sub-layers alternately disposed.

11. The display panel of claim 10, wherein the diffusion barrier layer has a thickness in a range of approximately 0.1 μm to approximately 10 mm.

12. The display panel of claim 5, wherein the diffusion barrier layer comprises one or both of silicon oxide and silicon nitride.

13. A display apparatus, comprising a display panel of claim 1.

14. An illumination light source, comprising:
    a thin film transistor driving back plane comprising a plurality of thin film transistors;
    a plurality of display elements on the thin film transistor driving back plane;
    an encapsulating structure on a side of the plurality of display elements away from the thin film transistor driving back plane and encapsulating the plurality of display elements;
    wherein the encapsulating structure comprises:
    a diffusion barrier layer on a side of the plurality of display elements away from the thin film transistor driving back plane for preventing diffusion of growth layer material into the plurality of display elements;
    a growth layer on a side of the diffusion barrier layer away from the plurality of display elements; and
    a graphene layer on a side of the growth layer away from the diffusion barrier layer.

15. A method of fabricating a display panel, comprising:
    forming a thin film transistor driving back plane comprising a plurality of thin film transistors;
    forming a plurality of display elements on the thin film transistor driving back plane; and
    forming an encapsulating structure on a side of the plurality of display elements away from the thin film transistor driving back plane and encapsulating the plurality of display elements;
    wherein forming the encapsulating structure comprises:
    forming a diffusion barrier layer on a side of the plurality of display elements away from the thin film transistor driving back plane for preventing diffusion of growth layer material into the plurality of display elements;
    forming a growth layer on a side of the diffusion barrier layer away from the plurality of display elements; and
    forming a graphene layer on a side of the growth layer away from the diffusion barrier layer.

16. The method of claim 15, wherein the graphene layer is formed to have a thickness in a range of approximately 2 nm to approximately 10 nm.

17. The method of claim 15, wherein the growth layer is formed using copper.

18. The method of claim 15, wherein the growth layer is formed directly adjacent to and in direct contact with the diffusion barrier layer.

19. The method of claim 18, wherein forming the diffusion layer comprises forming a plurality of sub-layers by a deposition method;
    the plurality of sub-layers are formed to comprise a plurality of first diffusion barrier sub-layers and a plurality of second diffusion barrier sub-layers alternately disposed;
    deposition rates for forming the plurality of sub-layers increase from a first value to a second value, and decrease from a second value to a third value; and
    the first value and the second value are deposition rates for forming a sub-layer most proximal to the display unit and a sub-layer most proximal to the growth layer, respectively.

20. The method of claim 15, wherein forming the graphene layer comprises growing the graphene layer on the growth layer using a chemical vapor deposition method.

* * * * *